US011799307B2

(12) United States Patent
Kazemi et al.

(10) Patent No.: US 11,799,307 B2
(45) Date of Patent: Oct. 24, 2023

(54) METHODS AND MECHANISMS FOR MONITORING CHARGING PORT FUNCTIONALITY

(71) Applicant: GM GLOBAL TECHNOLOGY OPERATIONS LLC, Detroit, MI (US)

(72) Inventors: Hamed Kazemi, Scarborough (CA); Milad Jalaliyazdi, Richmond Hill (CA); Seyedmohammad Hosseini, Thornhill (CA)

(73) Assignee: GM Global Technology Operations LLC, Detroit, MI (US)

( * ) Notice: Subject to any disclaimer, the term of this patent is extended or adjusted under 35 U.S.C. 154(b) by 262 days.

(21) Appl. No.: 17/475,698

(22) Filed: Sep. 15, 2021

(65) Prior Publication Data

US 2023/0083968 A1   Mar. 16, 2023

(51) Int. Cl.
| | | |
|---|---|---|
| *G01R 31/59* | (2020.01) | |
| *H02J 7/00* | (2006.01) | |
| *B60L 53/16* | (2019.01) | |
| *B60L 53/62* | (2019.01) | |
| *H01R 13/627* | (2006.01) | |
| *G01R 31/69* | (2020.01) | |
| *H01R 13/04* | (2006.01) | |

(52) U.S. Cl.
CPC ............ *H02J 7/0047* (2013.01); *B60L 53/16* (2019.02); *B60L 53/62* (2019.02); *G01R 31/69* (2020.01); *H01R 13/04* (2013.01); *H01R 13/6271* (2013.01); *H01R 2201/26* (2013.01)

(58) Field of Classification Search
CPC .............. G05B 23/0235; G05B 19/042; G05B 2219/2639; G05B 23/0213; G01R 31/3648; G01R 31/382; G01R 31/396; G01R 31/69; G01R 31/006; H01R 3/00; H01R 13/04; H01R 13/6271; H01R 2201/26; G01K 1/12; H01H 37/32; H02H 1/00; H02J 7/0047; B60L 53/16; B60L 53/62; Y02T 10/70; Y02T 10/7072; Y02T 90/14
See application file for complete search history.

(56) References Cited

U.S. PATENT DOCUMENTS

| | | | | |
|---|---|---|---|---|
| 7,944,667 | B2 * | 5/2011 | Ouwerkerk | B60L 3/04 |
| | | | | 361/106 |
| 9,490,640 | B2 * | 11/2016 | Pham | H02J 7/00309 |
| 9,751,413 | B2 * | 9/2017 | Im | B60L 53/16 |
| 9,804,034 | B2 * | 10/2017 | Jefferies | B60L 53/16 |
| 10,359,749 | B2 * | 7/2019 | Bogdan | H02J 13/00028 |

(Continued)

*Primary Examiner* — Vinh P Nguyen
(74) *Attorney, Agent, or Firm* — Quinn IP Law

(57) ABSTRACT

A vehicle configured to execute one or more methods for detecting function of a charging receptacle during a charging cycle. The methods include supplying a charging current through the pins; monitoring a pin temperature of the pins during the charging current; and applying a first step function to the charging current. The methods may also include monitoring a first step change in the pin temperature during the first step function; comparing the first step change in the pin temperature to a first expected temperature change to create a first deviation; and comparing the first deviation to a predetermined threshold. If the first deviation exceeds the predetermined threshold, signaling a maintenance alert, and if the first deviation is less than the predetermined threshold, logging the first deviation.

17 Claims, 4 Drawing Sheets

(56) References Cited

U.S. PATENT DOCUMENTS 10,481,038 B2\* 11/2019 Seemueller ............. G01M 3/26
2023/0186689 A1\* 6/2023 Hosseini ................... B60L 3/04
    701/29.4

\* cited by examiner

METHODS AND MECHANISMS FOR MONITORING CHARGING PORT FUNCTIONALITY

INTRODUCTION

The present disclosure relates to methods and mechanisms for determining the functionality, or assessing the health, of vehicles having electric charging capabilities, such as plug-in hybrid and electric vehicles.

SUMMARY

A vehicle configured to execute one or more methods for detecting function of a charging receptacle during a charging cycle is provided. The methods include supplying a charging current through the pins; monitoring a pin temperature of the pins during the charging current; and applying a first step function to the charging current. The methods also include monitoring a first step change in the pin temperature during the first step function; comparing the first step change in the pin temperature to a first expected temperature change to create a first deviation; and comparing the first deviation to a predetermined threshold. If the first deviation exceeds the predetermined threshold, signaling a maintenance alert, and if the first deviation is less than the predetermined threshold, logging the first deviation.

The methods may include applying a second step function to the charging current; monitoring a second step change in the pin temperature during the second step function; comparing the second step change in the pin temperature to a second expected temperature change to create a second deviation; and comparing the second deviation to the predetermined threshold. If the second deviation exceeds the predetermined threshold, signaling the maintenance alert, and if the second deviation is less than the predetermined threshold, logging the second deviation.

Use of the first step function may be scheduled, such that it does not occur during every charging cycle. The step function(s) may be scheduled based on vehicle history, such that the detecting function of the pins occurs only during extended charging cycles. The first expected temperature change may be calculated based on a formula equating stored energy to the difference between outflow energy and inflow energy added to energy generation, and/or may be calculated based on a physics-based thermal model.

The above features and advantages and other features and advantages of the present disclosure are readily apparent from the following detailed description of the best modes for carrying out the disclosure when taken in connection with the accompanying drawings.

DETAILED DESCRIPTION

Figure 1:
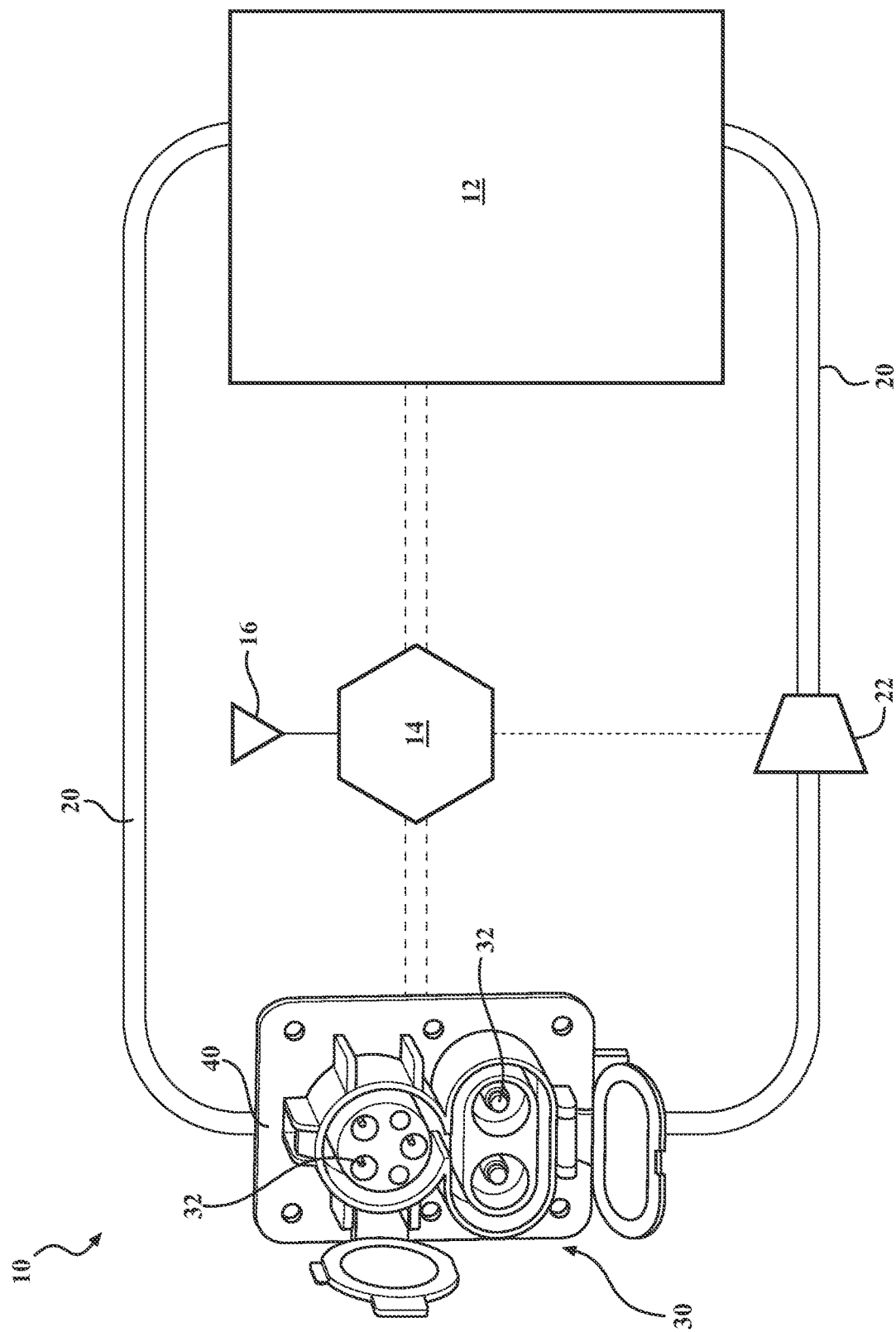
FIG. 1 is a schematic diagram of a vehicle having one or more rechargeable energy storage systems (RESS) in electrical communication with at least one charging receptacle.

Referring to the drawings, like reference numbers refer to similar components, wherever possible. All figure descriptions simultaneously refer to all other figures. FIG. 1 schematically illustrates a portion of a vehicle 10, shown highly schematically, which may be, for example and without limitation, an electric vehicle or a hybrid-electric vehicle. The vehicle 10 includes a rechargeable energy storage system (RESS) 12, which may include, for example and without limitation, a rechargeable battery or rechargeable battery pack.

A control system or controller 14 is operatively in communication with necessary components of the vehicle 10 in order to execute the methods, algorithms, and health assessments described herein. The controller 14 includes, for example and without limitation, a non-generalized, electronic control device having a preprogrammed digital computer or processor, a memory or non-transitory computer readable medium used to store data such as control logic, instructions, lookup tables, etc., and a plurality of input/output peripherals, ports, or communication protocols. The controller 14 is configured to execute or implement any and all control logic or instructions described herein.

Furthermore, the controller 14 may include, or be in communication with, a plurality of sensors, including, without limitation, those configured to sense or estimate ambient temperature outside of the vehicle 10, various coolant temperatures within the vehicle 10, and other sensing capabilities. The controller 14 may be dedicated to the specific aspects of the vehicle 10 described herein, or the controller 14 may be part of a larger control system that manages numerous functions of the vehicle 10.

The drawings and figures presented herein are diagrams, are not to scale, and are provided purely for descriptive and supportive purposes. Thus, any specific or relative dimensions or alignments shown in the drawings are not to be construed as limiting. While the disclosure may be illustrated with respect to specific applications or industries, those skilled in the art will recognize the broader applicability of the disclosure. Those having ordinary skill in the art will recognize that terms such as "above," "below," "upward," "downward," et cetera, are used descriptively of the figures, and do not represent limitations on the scope of the disclosure, as defined by the appended claims. Any numerical designations, such as "first" or "second" are illustrative only and are not intended to limit the scope of the disclosure in any way. Any use of the term, "or," whether in the specification or claims, is inclusive of any specific element referenced and also includes any combination of the elements referenced, unless otherwise explicitly stated.

Features shown in one figure may be combined with, substituted for, or modified by, features shown in any of the figures. Unless stated otherwise, no features, elements, or limitations are mutually exclusive of any other features, elements, or limitations. Furthermore, no features, elements, or limitations are absolutely required for operation. Any specific configurations shown in the figures are illustrative only and the specific configurations shown are not limiting of the claims or the description.

All numerical values of parameters (e.g., of quantities or conditions) in this specification, including the appended claims, are to be understood as being modified in all instances by the term about whether or not the term actually appears before the numerical value. About indicates that the stated numerical value allows some slight imprecision (with some approach to exactness in the value; about or reasonably close to the value; nearly). If the imprecision provided by about is not otherwise understood in the art with this ordinary meaning, then about as used herein indicates at least variations that may arise from ordinary methods of measuring and using such parameters. In addition, disclosure of ranges includes disclosure of all values and further divided ranges within the entire range. Each value within a range and the endpoints of a range are hereby all disclosed as separate embodiments.

When used, the term "substantially" refers to relationships that are ideally perfect or complete, but where manufacturing realties prevent absolute perfection. Therefore, substantially denotes typical variance from perfection. For example, if height A is substantially equal to height B, it may be preferred that the two heights are 100.0% equivalent, but manufacturing realities likely result in the distances varying from such perfection. Skilled artisans will recognize the amount of acceptable variance. For example, and without limitation, coverages, areas, or distances may generally be within 10% of perfection for substantial equivalence. Similarly, relative alignments, such as parallel or perpendicular, may generally be considered to be within 5%.

The vehicle 10 includes a communications system 16 that is capable of sharing information determined by the controller 14, for example, or other parts of the vehicle 10 with locations outside of the vehicle 10. For example, and without limitation, the communications system 16 may include cellular or Wi-Fi technology that allows signals to be sent to centralized locations, such as cloud storage or communications networks.

A coolant circuit 20 or coolant system is in communications with the RESS 12 and includes at least one pump 22. If the vehicle 10 also includes an internal combustion engine, the coolant circuit 20 may also pass through the internal combustion engine, or there may be separate coolant systems for other components of the vehicle 10.

A charging receptacle 30 having a plurality of pins 32 is in communication with, at least, the controller 14 and the RESS 12. The charging receptacle 30 cooperates with a charging station, generally through a charging cable, neither of which are shown. The charging cable may include some, or all, corresponding features to the pins 32. The charging receptacle 30 is also in communication with the coolant circuit 20.

The example charging receptacle 30 shown has a total of seven pins 32, some of which may not be viewable in the figures. The upper set (relative to FIG. 1) are for alternating current charging and the lower set (relative to FIG. 1) are for direct current charging. Note that not all of the pins 32 may be used for passing charging current, as some may be used for communication and/or controlling the charging current flowing from the charging station through the charging receptacle 30. Additionally, note that different charging ports may be utilized with the methods and mechanisms described herein, including those with additional or fewer total pins. For example, and without limitation, nine pin or five pin receptacles may be utilized, and receptacles having only AC or only DC connectivity may be utilized.

Several temperature measurement devices are embedded within, or adjacent to, the charging receptacle 30, such that the temperature of one or more of the pins 32 may be monitored and communicated to the controller 14. For example, and without limitation, thermocouples may be disposed near some, or all, of the pins 32.

The charging receptacle 30 includes a locking mechanism or lock 40, which may cooperate with a corresponding locking mechanism on the charging cable. Note that not all charging stations or charging receptacles 30 will include the lock 40 or corresponding structure.

Figure 2A:
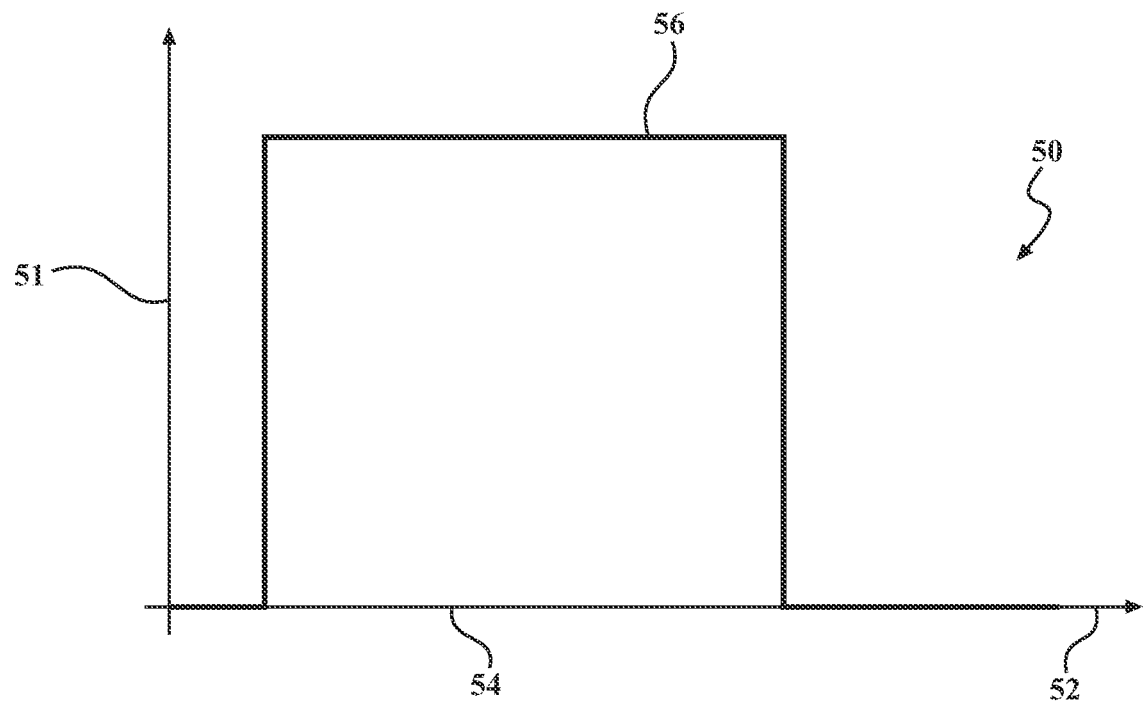
FIG. 2A is a schematic graph of a charging current applied through the charging receptacle.
Figure 2B:
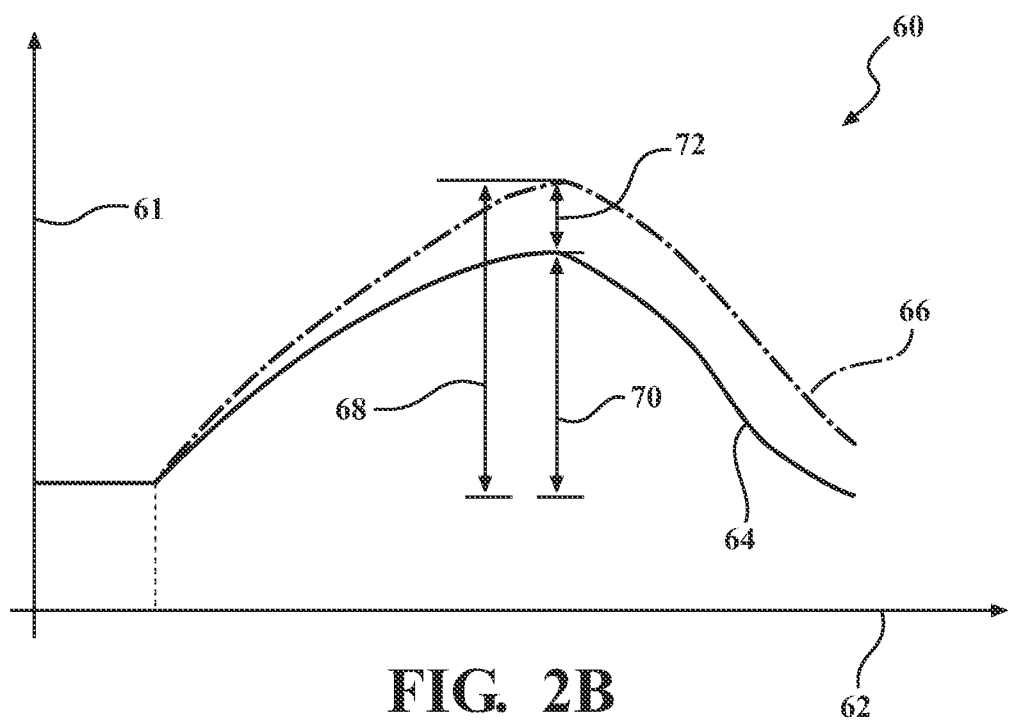
FIG. 2B is a schematic graph of temperature measurements of pin within the charging receptacle while subject to the schematic charging current of FIG. 2A.

Referring now to FIG. 2A and FIG. 2B, and with reference to the other figures, there are shown schematic graphs illustrating mechanisms, methods, or algorithms for testing and/or detecting functionality of the charging receptacle 30. FIG. 2A shows a schematic current graph 50, with the y-axis showing current 51 and the x-axis showing time 52. The current graph 50 shows current flowing through the charging receptacle 30 while subject to a charging current.

As shown in FIG. 2A, a charging current, which may be referred to as a baseline charge current 54, is supplied through the pins 32. During this time, the vehicle 10 is subject to a charging cycle that is geared toward recharging the RESS 12. The controller 14 is also monitoring the pin temperature of the pins 32, at least while subject to the charging current. The controller 14, or another control system managing the charging cycle, applies a first step function 56 to the charging current. Note that the baseline charge current 54 may be either zero or non-zero. Where the baseline charge current 54 is zero, the health assessment described herein may occur before the charge cycle is started.

FIG. 2B shows a schematic temperature graph 60, with the y-axis showing temperature 61 and the x-axis showing time 62. The schematic temperature graph 60 illustrates an expected temperature 64, which may also be referred to as a normal temperature, and a measured temperature 66.

During the first step function 56, the controller 14 is monitoring a first step change 68 in pin temperature. This may be the difference between the temperature during the baseline charge current 54 and the temperature increase caused by the first step function 56.

The temperature increase may be caused by Joule heating, which may be considered the physical effect by which the passage of current through an electrical conductor produces thermal energy. As would be recognized by skilled artisans, imperfections or degradations in the pins 32 may result in greater Joule heating than would be expected in pins 32 that substantially lack such imperfections.

The controller 14 compares the first step change 68 in pin temperature to a first expected temperature change 70 to create a first deviation 72. This generally quantifies the amount excess, or unexpected, heat generated by the pins 32 during the first step function 56.

The controller 14 may then compare the first deviation 72 to a predetermined threshold. If the first deviation 72 exceeds the predetermined threshold, the controller 14 may then signal a maintenance alert, and if the first deviation 72 is less than the predetermined threshold, the controller 14 may log or store the first deviation 72. In some cases, logging the first deviation 72 may include sending the data to a cloud or network from storage offboard the vehicle 10. The thresholds may be specific to the type of vehicle 10 or may be general thresholds. Additionally, the thresholds may be updated, such as through the cloud network, during the operational lifetime of the vehicle 10.

Depending on the magnitude of the first deviation 72, the maintenance alert may include several possible actions or alerts. For example, and without limitation, the maintenance alert may include alerting the operator of the vehicle 10 that the operator should take the vehicle 10 for service, or, in some cases, stopping the charging cycle early to prevent further damage to the charging receptacle 30 or other portions of the vehicle 10.

Factors causing degradation of, or damage to, the pins 32, may include, without limitation: external forces bending the pins 32, particulates grinding the surface of the pins 32, or unintended exposure of the charging receptacle 30 or pins 32 to heat. Factors resulting in further degradation of the pins 32 during charging cycles may include, without limitation: corrosion, surface cracks, electric arcing, or surface plating wear.

Identifying faults, degradation, or imperfection in the pins 32, or other components of the vehicle 10, may provide benefits to the vehicle 10, particularly when there is early detection such that minor faults are identified prior to creating more significant problems. For example, and without limitation, benefits includes: preventing loss of propulsion or inability to charge the vehicle 10 and the RESS 12, reduced towing and alternative transportation cost, and reduced labor costs associated with fault isolation or substantial damage to the systems of the vehicle 10.

Note that, in addition to the first step function 56, the controller 14 may apply additional step functions to further test function of the charging receptacle 30 during the charging cycle. Therefore, the controller 14 may apply a second step function and compare a second step change in pin temperature to a second expected temperature change to create a second deviation. Similarly, the controller may compare the second deviation to the predetermined threshold and determine whether signaling the maintenance alert and/or logging the temperature deviation is warranted.

In many cases, the controller 14 will not try to test functionality of the charging receptacle 30 during every charging cycle. For example, and without limitation, utilizing the step current—or other testing mechanisms, such as those described herein—may delay completion of the charging event to analyze functionality. Therefore, it may be beneficial to schedule this health assessment analysis occasionally, such as, for example and without limitation, during extended charging cycles.

To determine during which of the charging cycles should test functionality of the system, the controller 14 may use the history of the vehicle 10 to better determine when an extended charging cycle is likely to occur. For example, and without limitation, the scheduling methods may analyze the GPS location and history of previous charging cycles to determine that the vehicle 10 is often charged for extended periods of time when at home, such as overnight, or when at a work location. Other factors may include, without limitation: time of day, ambient temperature, RESS 12 state of charge, battery power requested, time since last health assessment, and the type of charging station to which the vehicle 10 is connected.

The scheduler method or function attempts to ensure uninterrupted charging when the operator wants to quickly gain some mileage without any delay, such as during rapid charges while traveling, and plans the health monitoring for situation that the operator leaves the vehicle 10 to charge for a longer time. Skilled artisans will recognize the difference between short charging cycles and extended charging cycles. In one example, and without limitation, a predicted charging cycle lasting three hours or more may be considered an extended charging cycle; or when the vehicle 10 will remain connected to the charging station after RESS 12 is fully charged.

Both the first step function 56 and any subsequent step functions may be controlled by the scheduler. In some cases, the scheduler function may occur offboard of the vehicle, such as within a cloud network, and be communicated to the controller 14. Note that, even with the scheduler estimating length of charging cycles, the operator of the vehicle 10 may have an irregular stop, such that the controller 14 may abort health assessment of the charging systems.

In order to complete the health assessment of the charging receptacle and its pins 32, the controller 14 uses different mechanisms for calculating the first expected temperature change 70. For example, and without limitation, calculations may be based on a formula equating stored energy to the difference between outflow energy and inflow energy added to energy generation, which may include a physics-based thermal model.

Equation 1 shows the balanced physics-based equation.

$$\dot{E}_{in} - \dot{E}_{out} + \dot{E}_g = \dot{E}_{st} \tag{1}$$

In Equation 1: $\dot{E}_{in}$ is inflow thermal and mechanical energy transfer; $\dot{E}_{out}$ is outflow thermal and mechanical energy transfer, such as through the coolant circuit 20 or convective heat transfer to ambient air; $\dot{E}_g$ is thermal energy generation, such as by Joule heating; and $\dot{E}_{st}$ is stored thermal energy, which increases the temperature of the pins 32.

Equations 2-5 contain portions of Equation 1.

$$\dot{E}_{in} = 0 \tag{2}$$

$$\dot{E}_g = I^2 R \tag{3}$$

$$\dot{E}_{out} = h_{amb} A_1 (T - T_{amb}) + h_f A_2 (T - T_f) \tag{4}$$

$$\dot{E}_{st} = \rho V c \frac{dT}{dt} \tag{5}$$

In Equations 2-5: R=electrical resistance; I=electrical current; h=convection heat transfer coefficient, where $h_{amb}$ is for the ambient air and $h_f$ is for fluid; T is the sensed temperature of the receptacle pins 32; $T_{amb}$ is ambient air temperature; $T_f$ is coolant fluid temperature; $A_1$ is surface area between the charging receptacle 30 and the ambient air; $A_2$ is surface area between the charging receptacle 30 and the coolant fluid; and $\rho V c$ is thermal capacitance. By plugging Equations 2-5 into Equation 1, we can form Equation 6.

$$-hA_1(T - T_\infty) - h_f A_2(T - T_f) + I^2 R = \rho V c \frac{dT}{dt} \tag{6}$$

Re-arranging the Equation 6, and using lumped parameters of $P_1$, $P_2$, and $P_3$, we form Equation 7, where: $P_1 = \rho V c$; $P_2 = h_{amb} * A_1$; and $P_3 = H_f * A_2$.

$$P_1 \frac{dT}{dt} + P_2(T - T_\infty) + P_3(T - T_f) - I^2 R = 0 \tag{7}$$

From Equation 7, the controller 14, or a subsystem thereof, can determine the expected temperature 64, and calculate the first deviation 72 from the difference between the first step change 68 and the first expected temperature change 70. Equation 7 may also be useful for determining the effective resistance of one or more pins 32. Note that onboard calculations, may occur through, for example, and without limitation, modeling functions or lookup tables.

Figure 3:
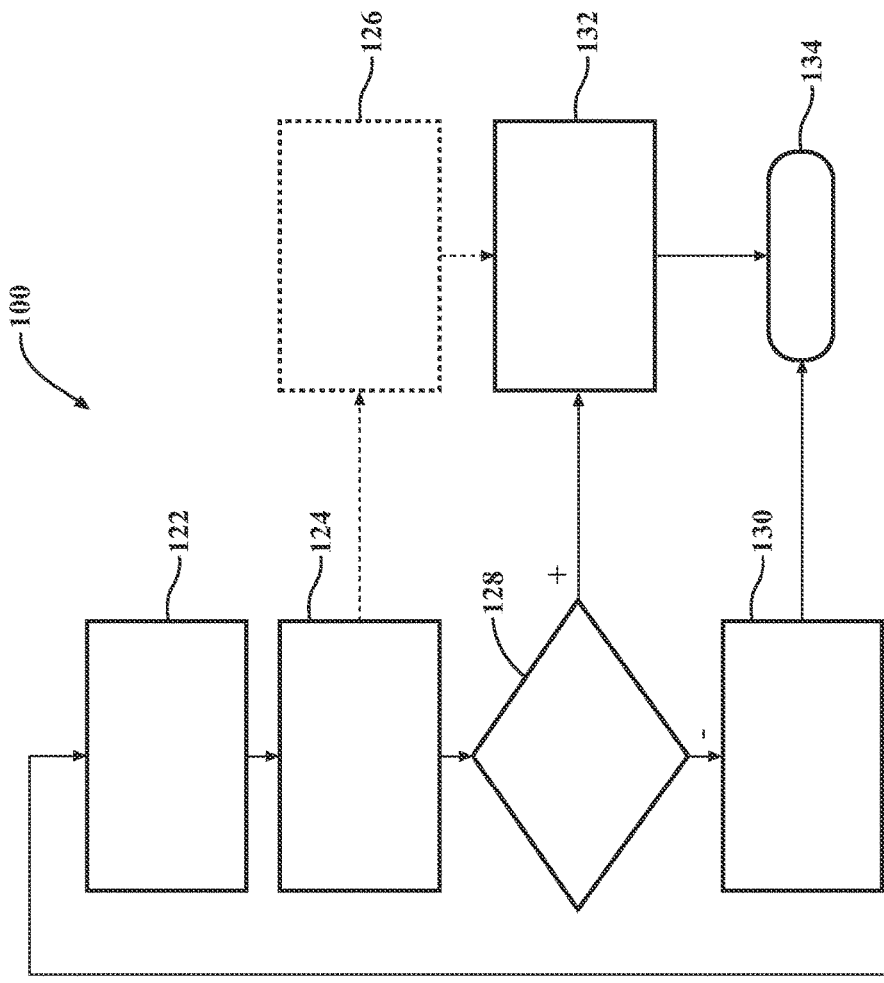
FIG. 3 is a schematic diagram of a flow chart for determining health of the charging receptacle.
Figure 3:
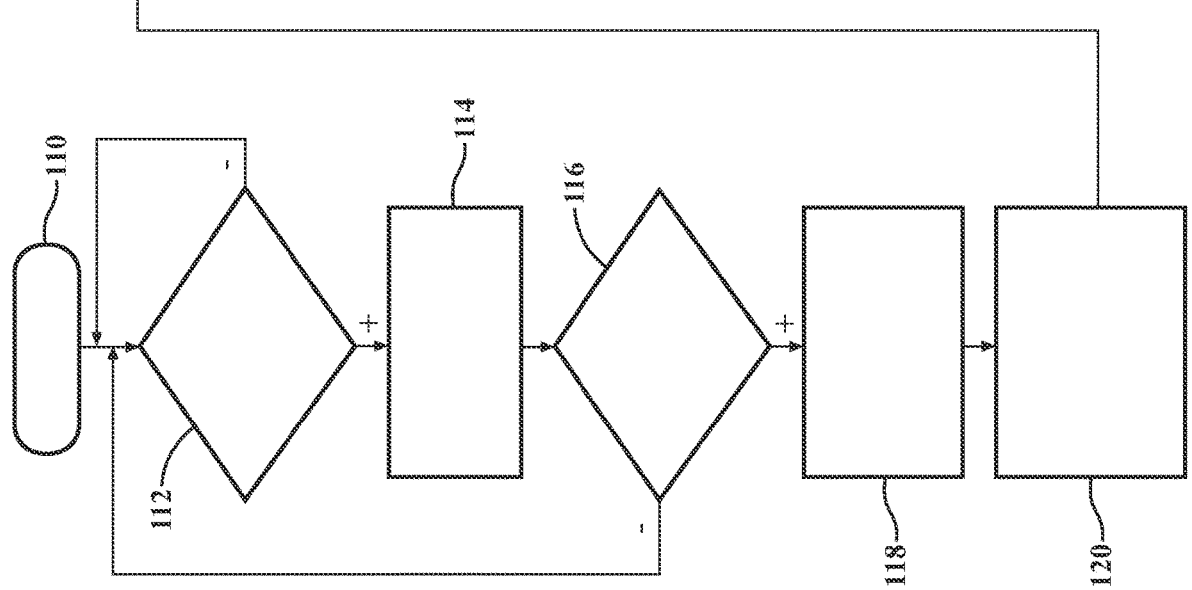

Referring now to FIG. 3, and with reference to all other figures, there is shown schematic flow chart illustrating mechanisms, methods, or algorithms for testing and/or detecting functionality of the charging receptacle 30. A method 100 is shown in FIG. 3 and illustrates one way of assessing the health of the charging receptacle 30, in addition to other portions of the vehicle 10, as described herein.

Step 110: Start/Initialize.

The method 100 may begin operation when called upon by the controller 14, may be constantly running, or may be looping iteratively.

Step 112: Connected to Station and Ready to Charge?

The method 100 determines whether the vehicle 10 is connected to a charging station and is ready to begin charging the RESS 12. If these conditions are not met, the method reverts to the start step 110, which may include iterating or pausing until before beginning again. Alternatively, the start step 110 may only initialize whenever the vehicle 10 is connected to the charging station and ready to charge.

Step 114: Health Assessment Scheduler.

The method 100 communicates with the scheduler, whether onboard the vehicle 10 or through a communications network. This helps determine whether the vehicle 10 should be tested.

Step 116: Enabling Conditions Met?

If the conditions of the health assessment scheduler are not met, the method reverts to the start step 110, which may include iterating or pausing until before beginning again. If the conditions are met, the method 100 proceeds to step 118.

Step 118: Monitor Temperature.

At this step, the method 100 monitors many temperature conditions, including, without limitation: ambient air, coolant fluid, and charging receptacle 30, which may include one or more of the individual pins 32. These conditions form the baseline during the initial charging phase.

Step 120: Apply Step Function and Monitor Temperature.

After establishing the baseline, the method 100 applies step conditions. The controller 14 may apply, for example, the first step function 56 to the charging current, as illustrated in FIG. 2A. The method 100 then monitors the changing temperature conditions in the charging receptacle 30 during, and likely after, the first step function 56, such as with one or more thermocouples effectively sensing the charging receptacle 30.

Step 122: Determine Expected Temperature and Resistance.

The method 100 determines the expected temperature, such as from the physics-based model and may also determine the resistance through the one or more pins 32 or the whole charging receptacle 30. The method 100 uses the expected temperature and the resistance in subsequent calculations and/or determinations.

Step 124: Estimate Deviation from Healthy Receptacle.

The method 100 estimates the deviation from a healthy—i.e., operating normally—charging receptacle 30. The method 100 may use a comparison between the expected temperature and the measured temperature to derive the deviation, such as the first deviation 72 illustrated in FIG. 2B. Alternatively, the method 100 may compare the calculated resistance to an expected resistance, based on the current and voltage conditions coming from the charging station.

Step 126: Determine Receptacle/Pin Health and Report (Optional).

The method 100 may include a step to determine the overall health of the charging receptacle 30 or individual pins 32. In turn, this health assessment may be logged or otherwise reported, such as to the cloud network. Determining the receptacle health, and reporting the health determination, may also be considered as an umbrella step encompassing steps 124-132. In many cases, summary reports may be sent to the operator of the vehicle 10 when the charging receptacle 30 is completely healthy.

Step 128: Predetermined Thresholds Exceeded?

The method 100 may compare the temperature deviation, resistance deviation, or both, calculated in step 120 to predetermined thresholds. As recognized by skilled artisans, these deviations may be vehicle specific based on, for example and without limitation, RESS 12 type and size, configuration of the charging receptacle 30, drivetrain type, and other system configurations.

Step 130: Continue Charging.

Where the determination in step 128 is negative—i.e., the answer is no, as represented by a "−" on the flow chart—the method 100 allows the vehicle 10 to continue charging. In such a situation, the method 100 may have determined that it is generally not detrimental to continue the charging cycle for the charging receptacle 30, the RESS 12, or other components of the vehicle 10.

Step 132: Generate Fault Message.

Where the determination in step 128 is positive—i.e., the answer is yes, as represented by a "+" on the flow chart—the method 100 generates a fault message. This may include, for example and without limitation: signaling the operator of the vehicle, such as through an onboard light, a messaging system, or a portable device app; and/or notifying a manager of the fleet, if the vehicle 10 is part of a fleet.

Furthermore, depending on the severity of the excursions over the threshold, step 132 may also include stopping the charging cycle. Particularly where the optional step 126 determines that the health of the charging receptacle 30 is greatly degraded, the method 100 may determine that it is best to shut down the charging cycle without much further delay. This would likely generate additional fault messages, including alerting service personnel, or repair personnel for the vehicle 10 and/or the charging station.

Step 134: End/Loop.

After either step 130 or step 132, the method 100 ends. In many configurations, the method 100 will loop constantly, or at a regular interval, while the charging cycle is operational.

Figure 4:
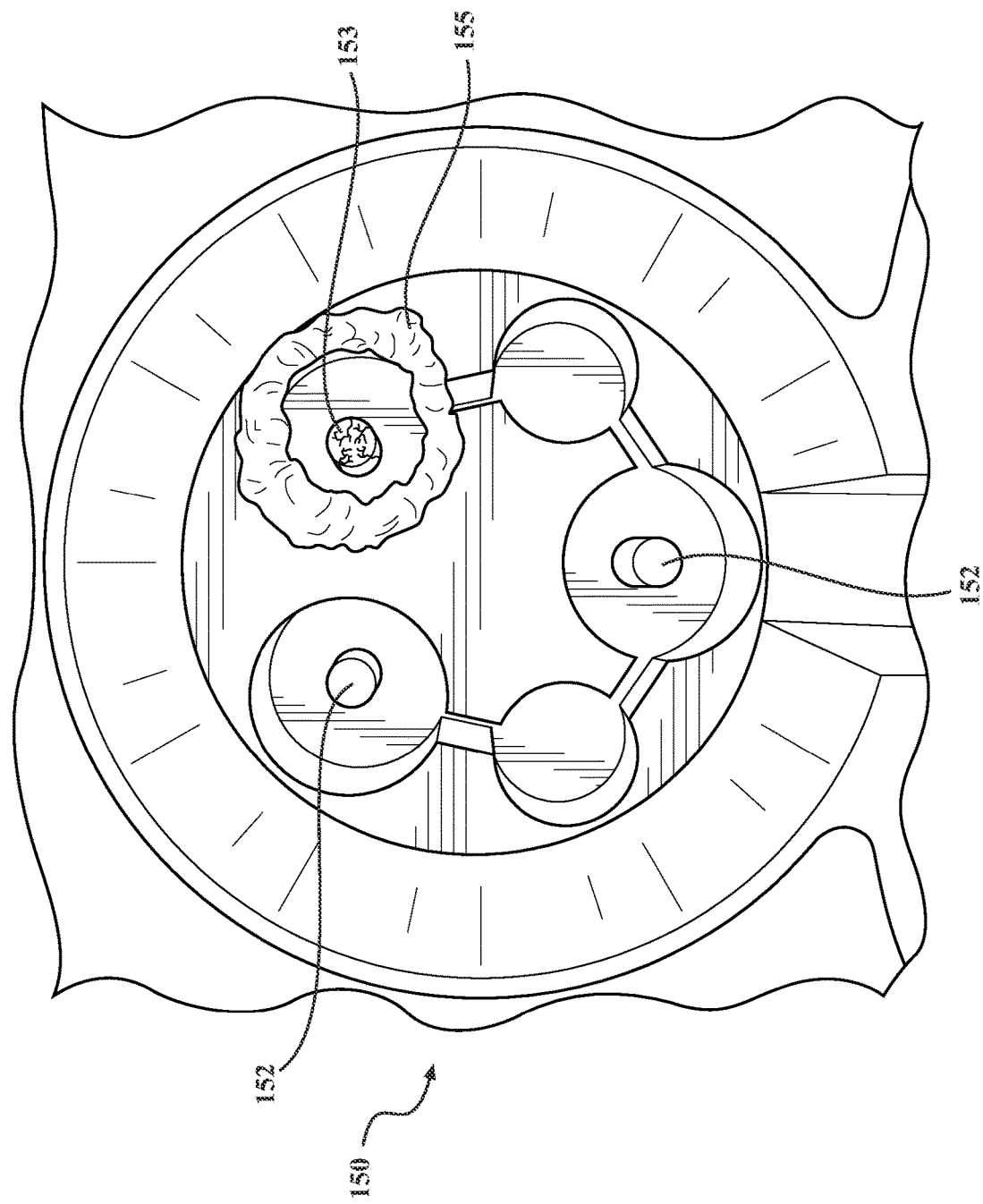
FIG. 4 is a schematic diagram of a charging receptacle having one or more faulted pins.

Referring now to FIG. 4, and with reference to all other figures, there is shown a charging receptacle 150, which illustrates some possible damage to charging receptacles, as described herein. Skilled artisans will recognize that the charging receptacle 150 is similar to all, or portions of, the charging receptacle 30 shown in FIG. 1.

The charging receptacle 150 includes a plurality of pins 152, which are substantially in undamaged, or working, condition. However, the charging receptacle 150 also includes a damaged pin 153. The damaged pin 153 may have been cracked by an improperly aligned charging cable mating with the charging receptacle 150. Furthermore, the damaged pin 153 may have caused electric arcing, such that the housing of the charging receptacle 150 around the damaged pin 153 has been melted.

Additional methods for health assessment of charging receptacles, such as the charging receptacle 150 or the charging receptacle 30 may include image analysis of the respective charging receptacle. For example, and without limitation, the operator of the vehicle may be prompted to take a picture or photograph of the charging receptacle 150 at periodic intervals or may take the photograph whenever the operator is so inclined. Thereafter, the photograph is sent, for example and without limitation, to a cloud network for image processing. The cloud network may utilize any number of techniques, including, without limitation, human review, image identification, or artificial intelligence, to identify possible damage to the charging receptacle 150.

If the cloud network, or similarly equipped systems, determines that there is likely damage on the charging receptacle 150, a maintenance alert may be signaled or sent. The maintenance alert may include, for example and without limitation: signaling the operator of the vehicle, such as through an onboard light, a messaging system, or a portable device app; notifying a manager of the fleet, if the vehicle 10 is part of a fleet; or alerting service personnel or repair personnel.

The smartphone or personal device camera may utilize an app or upload images for analysis through the internet. Possible damage that may be detectable includes, without limitation, tiny burn marks caused by electric arcs, grindings, cracks, or melting points.

As shown in FIG. 1, the vehicle 10 includes the coolant circuit 20. In addition to performing health assessment on the charging receptacle 30, itself, the vehicle 10 may be configured to perform health assessments of the coolant circuit 20. The flow chart of FIG. 3 represents a similar algorithm or method for assessing the coolant circuit 20.

The process of assessing the coolant circuit 20 includes monitoring temperature similar to the method 100 shown in FIG. 3. However, at step 120, instead of applying a step to the charging current, the controller 14 holds the charging current steady while applying a step to the liquid coolant flow through the coolant circuit 20 and monitors the temperature change during said coolant step.

The coolant step may be applied as an increase or decrease. For example, if the coolant flow increases through the coolant circuit 20, it would be expected that the temperature of the pins 32 in the charging receptacle 30 will decrease. However, if the coolant circuit 20 is not operating properly, the temperature decrease may not be fully realized.

A deviation may be calculated from the difference between the measured temperature and the expected temperature of the pins 32. From that deviation, the controller 14 can compare against thresholds to assess the health of the coolant circuit 20, in a similar manner to the methods shown in FIG. 3.

As shown in FIG. 1, the charging receptacle 30 includes the lock 40, which interacts with a corresponding locking mechanism on the charging cable. However, the lock 40 of the charging cable lock may become damaged or not work properly. Therefore, it may be beneficial to have a health assessment of the lock 40 and/or charging cable lock.

In many interactions, the lock 40 and charging cable lock must successfully latch to one another before the charging cycle may begin or initiate. Therefore, the controller 14 knows whether the lock 40 and charging cable lock have successfully engaged. As such health assessments may be performed on the lock 40, the corresponding charging cable lock, or both.

For example, and without limitation, if the lock 40 normally latches successfully on the first or second try, but at a specific charging station it takes five attempts to latch, that suggests that the charging cable lock may be damaged or otherwise not working properly. The controller 14 may then use a communications network to signal that the charging station may need inspection and/or repair. Similarly, and without limitation, if the lock 40 has difficulty latching successfully to a charging station that normally latches on the first or second try, the controller 14 may determine that the lock 40 is not working properly and send a maintenance message or reminder for inspection and/or repair of the lock 40.

The detailed description and the drawings or figures are supportive and descriptive of the subject matter herein.

While some of the best modes and other embodiments have been described in detail, various alternative designs, embodiments, and configurations exist.

Furthermore, any embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

The invention claimed is:

1. A method for detecting function of a plurality of pins in a charging receptacle of a vehicle during a charging cycle, comprising:
   supplying a charging current through the pins;
   monitoring a pin temperature of the pins, with a controller, while supplying the charging current;
   applying a first step function, from the controller, to the charging current;
   monitoring a first step change in the pin temperature during the first step function;
   comparing the first step change in the pin temperature to a first expected temperature change to create a first deviation; and
   comparing the first deviation to a predetermined threshold:
   if the first deviation exceeds the predetermined threshold, signaling a maintenance alert, and
   if the first deviation is less than the predetermined threshold, logging the first deviation.

2. The method of claim 1, further comprising:
   applying a second step function, from the controller, to the charging current;
   monitoring a second step change in the pin temperature during the second step function;
   comparing the second step change in the pin temperature to a second expected temperature change to create a second deviation; and
   comparing the second deviation to the predetermined threshold:
   if the second deviation exceeds the predetermined threshold, signaling the maintenance alert, and
   if the second deviation is less than the predetermined threshold, logging the second deviation.

3. The method of claim 2, further comprising:
   scheduling the first step function and the second step function,
   wherein the first step function and the second step function do not occur during every charging cycle, and
   wherein detecting function of the pins occurs during extended charging cycles.

4. The method of claim 1, further comprising:
   scheduling the first step function, such that the first step function does not occur during every charging cycle.

5. The method of claim 4, further comprising:
   scheduling the first step function based such that the detecting function of the pins occurs during extended charging cycles.

6. The method of claim 1, further comprising:
   calculating the first expected temperature change based on a formula equating stored energy to a difference between outflow energy and inflow energy added to energy generation, wherein the first deviation is calculated based on the formula equating the difference between outflow energy and inflow energy added to energy generation.

7. A vehicle, comprising:
a rechargeable energy storage system (RESS) selectively subject to a charging cycle;
a charging receptacle having a plurality of pins;
a controller in communication with the RESS and the charging receptacle, wherein the controller is configured to detect function of the charging receptacle during the charging cycle by:
supplying a charging current through the pins;
monitoring a pin temperature of the pins while supplying the charging current;
applying a first step function to the charging current;
monitoring a first step change in the pin temperature during the first step function;
comparing the first step change in the pin temperature to a first expected temperature change to create a first deviation; and
comparing the first deviation to a predetermined threshold:
if the first deviation exceeds the predetermined threshold, signaling a maintenance alert, and
if the first deviation is less than the predetermined threshold, logging the first deviation.

8. The vehicle of claim 7, wherein the controller is further configured to detect function of the charging receptacle during the charging cycle by:
applying a second step function to the charging current;
monitoring a second step change in the pin temperature during the second step function;
comparing the second step change in the pin temperature to a second expected temperature change to create a second deviation; and
comparing the second deviation to the predetermined threshold:
if the second deviation exceeds the predetermined threshold, signaling the maintenance alert, and
if the second deviation is less than the predetermined threshold, logging the second deviation.

9. The vehicle of claim 8, wherein the controller is further configured to detect function of the charging receptacle during the charging cycle by:
scheduling the first step function and the second step function,
wherein the first step function and the second step function do not occur during every charging cycle, and
wherein detecting function of the pins occurs during extended charging cycles.

10. The vehicle of claim 7, wherein the controller is further configured to detect function of the charging receptacle during the charging cycle by:
scheduling the first step function, such that the first step function does not occur during every charging cycle.

11. The vehicle of claim 10, wherein the controller is further configured to detect function of the charging receptacle during the charging cycle by:
scheduling the first step function, such that the detecting function of the pins occurs during extended charging cycles.

12. The vehicle of claim 7, wherein the controller is further configured to detect function of the charging receptacle during the charging cycle by:
calculating the first expected temperature change based on a formula equating stored energy to a difference between outflow energy and inflow energy added to energy generation, wherein the first deviation is calculated based on the formula equating the difference between outflow energy and inflow energy added to energy generation.

13. The vehicle of claim 7, further comprising:
a lock on the charging receptacle, wherein the lock prevents initiation of the charging cycle unless successfully latched to corresponding structure.

14. A non-transitory computer-readable medium including contents that are configured to cause a computing system to perform a method related to a plurality of pins in a charging receptacle of a vehicle during a charging cycle, the method comprising:
supplying a charging current through the pins;
monitoring a pin temperature of the pins while supplying the charging current;
applying a first step function to the charging current;
monitoring a first step change in the pin temperature during the first step function;
comparing the first step change in the pin temperature to a first expected temperature change to create a first deviation; and
comparing the first deviation to a predetermined threshold:
if the first deviation exceeds the predetermined threshold, signaling a maintenance alert, and
if the first deviation is less than the predetermined threshold, logging the first deviation.

15. The computer-readable medium of claim 14, further comprising:
applying a second step function to the charging current;
monitoring a second step change in the pin temperature during the second step function;
comparing the second step change in the pin temperature to a second expected temperature change to create a second deviation; and
comparing the second deviation to the predetermined threshold:
if the second deviation exceeds the predetermined threshold, signaling the maintenance alert, and
if the second deviation is less than the predetermined threshold, logging the second deviation.

16. The computer-readable medium of claim 15, further comprising:
scheduling the first step function, such that the first step function does not occur during every charging cycle.

17. The computer-readable medium of claim 16, further comprising:
calculating the first expected temperature change based on a formula equating stored energy to a difference between outflow energy and inflow energy added to energy generation, wherein the first deviation and the second deviation are calculated based on the formula equating the difference between outflow energy and inflow energy added to energy generation.

* * * * *